US011614810B2

(12) United States Patent
Kao et al.

(10) Patent No.: US 11,614,810 B2
(45) Date of Patent: Mar. 28, 2023

(54) INPUT DEVICE

(71) Applicant: PEGATRON CORPORATION, Taipei (TW)

(72) Inventors: Ming-Tse Kao, Taipei (TW); Yu-Cheng Pan, Taipei (TW); Tsung-Yueh Yu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 14 days.

(21) Appl. No.: 17/374,416

(22) Filed: Jul. 13, 2021

(65) Prior Publication Data

US 2022/0342497 A1 Oct. 27, 2022

(30) Foreign Application Priority Data

Apr. 27, 2021 (TW) .................................. 110115160

(51) Int. Cl.
*G06F 3/0354* (2013.01)
*H03K 17/965* (2006.01)

(52) U.S. Cl.
CPC ...... *G06F 3/03549* (2013.01); *G06F 3/03543* (2013.01); *H03K 17/965* (2013.01); *H03K 2217/9653* (2013.01)

(58) Field of Classification Search
CPC ............ G06F 3/03549; G06F 3/03543; H03K 2217/9653; H03K 17/965
See application file for complete search history.

(56) References Cited

U.S. PATENT DOCUMENTS

| 7,616,188 | B1 | 11/2009 | Blandin et al. | |
| 2003/0025673 | A1 | 2/2003 | Ledbetter et al. | |
| 2005/0110759 | A1* | 5/2005 | Koo | G06F 3/0362 345/163 |
| 2005/0146500 | A1* | 7/2005 | Cheng | H01H 25/04 345/163 |
| 2007/0159462 | A1* | 7/2007 | Yen | G06F 3/0362 345/163 |
| 2008/0192011 | A1 | 8/2008 | Yu | |
| 2010/0238113 | A1 | 9/2010 | Wu | |
| 2011/0037696 | A1 | 2/2011 | Tang | |
| 2011/0187644 | A1 | 8/2011 | Shih et al. | |
| 2013/0215031 | A1* | 8/2013 | Peng | G06F 3/03543 345/163 |

FOREIGN PATENT DOCUMENTS

TW I432998 B 4/2014

\* cited by examiner

*Primary Examiner* — Muhammad N Edun

(74) *Attorney, Agent, or Firm* — Muncy, Geissler, Olds & Lowe, P.C.

(57) ABSTRACT

The present invention relates to an input device. The input device includes a circuit board, a wheel, a supporting frame, a push button switch and a tilt switch. The wheel has a rotary shaft. The supporting frame includes a body, an extension arm, a first and a second supporting portion. The wheel is pivotally connected to the body by the rotary shaft. The extension arm is disposed at the side edge of the body. The first and second supporting portion are connected to the body, where the second supporting portion is disposed between the rotary shaft and the first supporting portion. The push button switch is corresponding to the body. When the wheel is pressed, the body is driven to trigger the push button switch. The tilt switch is corresponding to the extension arm. When the wheel tilts, the extension arm is driven to trigger the tilt switch.

9 Claims, 5 Drawing Sheets

INPUT DEVICE

BACKGROUND

Technical Field

The present invention relates to an input device, and in particular, to an input device having a tilt wheel.

Related Art

With the rapid development of technologies and the advent of the computer multimedia age, people are becoming more dependent on various computer devices. Various peripheral input devices for enabling users to communicate with computer systems, such as mouses, keyboards, and microphones, play an important role, among which mouses are the most commonly used input devices for users. A mouse generally has a wheel, for the user to perform operations such as zooming in, zooming out, or scrolling an image. In the related art, there is another type of mouse which has a wheel for scrolling left and right, so as to controlling the horizontal scrolling of the screen. The mouse having such a wheel is referred to as a tilt wheel mouse. However, in the related art, the wheel of the tilt wheel mouse needs to be scrolled with a great amplitude in order to achieve the horizontal controlling, that is, a user needs to apply a large force to the wheel, making it convenient to use.

Therefore, it is necessary to devise a novel input device to resolve the deficiency of the related art.

SUMMARY

A main objective of the present invention is to provide an input device having a tilt wheel.

In order to achieve the foregoing objective, the input device of the present invention includes a circuit board, a wheel, a supporting frame, a push button switch and at least one tilt switch. The wheel has a rotary shaft. The supporting frame is configured to support the wheel and is adapted to be driven by the wheel. The supporting frame includes a body, at least one extension arm, a first supporting portion and a second supporting portion. The wheel is pivotally connected to the body by the rotary shaft, allowing the wheel to rotate relative to the body and drive the supporting frame to press downward and tilt toward at least one side edge. The at least one extension arm is disposed at the side edge of the body. The first supporting portion is pivoted on an end of the body, so that the body can be driven by the wheel to press downward. The second supporting portion is connected to the body and supports the circuit board, where the second supporting portion is disposed between the rotary shaft and the first supporting portion. The push button switch is disposed on the circuit board and corresponding to the body, and when the wheel is pressed, the wheel drives the body to press downward to trigger the push button switch. The at least one tilt switch is disposed on the circuit board and corresponding to at least one extension arm, and when the wheel tilts, the wheel drives the at least one extension arm to tilt to trigger the at least one tilt switch.

DETAILED DESCRIPTION

To enable the examiner to understand the technical content of the present invention better, specific exemplary embodiments are described below.

Figure 1:
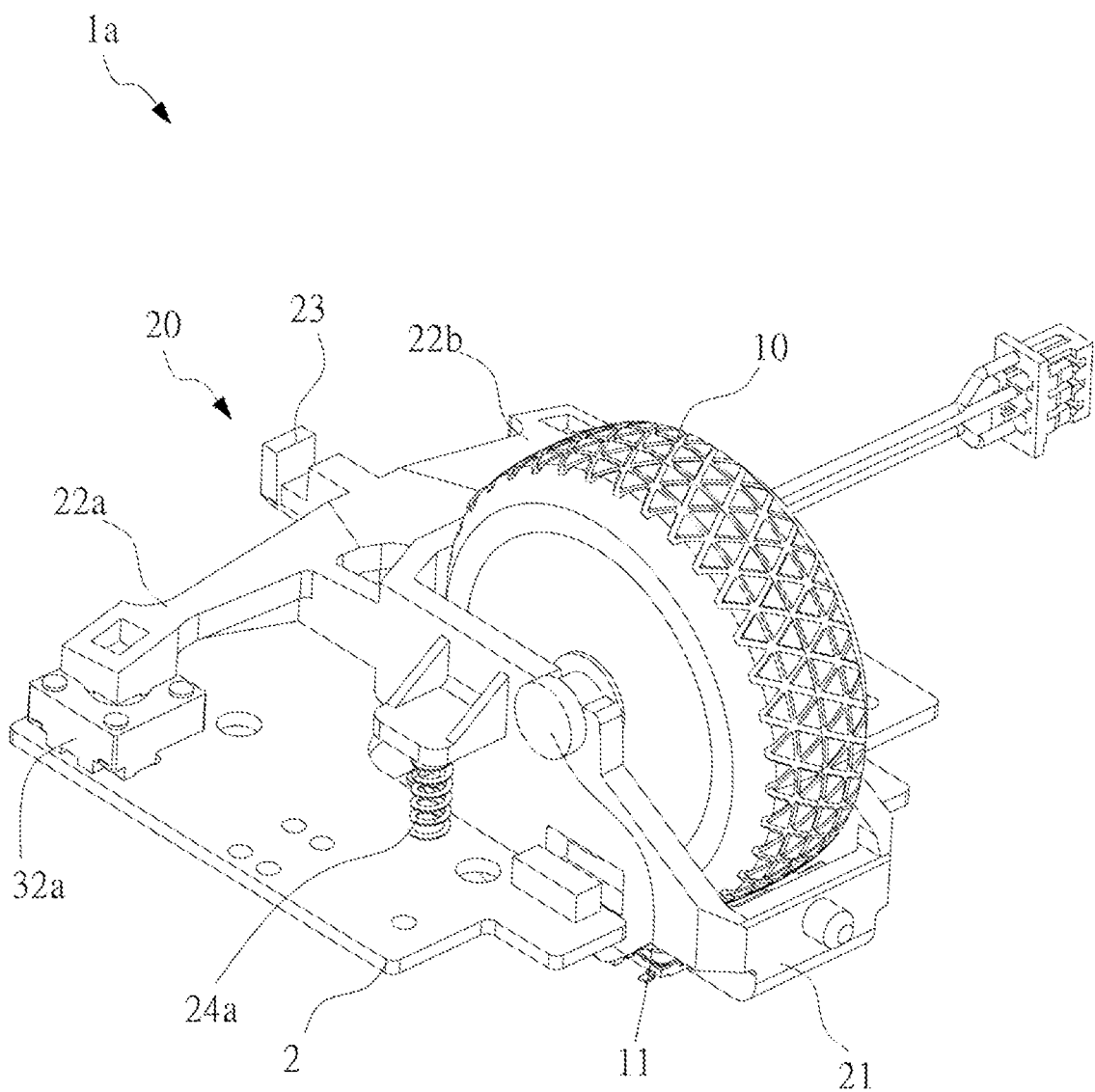
FIG. 1 is a three-dimensional schematic view of an input device according to a first embodiment of the present invention.
Figure 2:
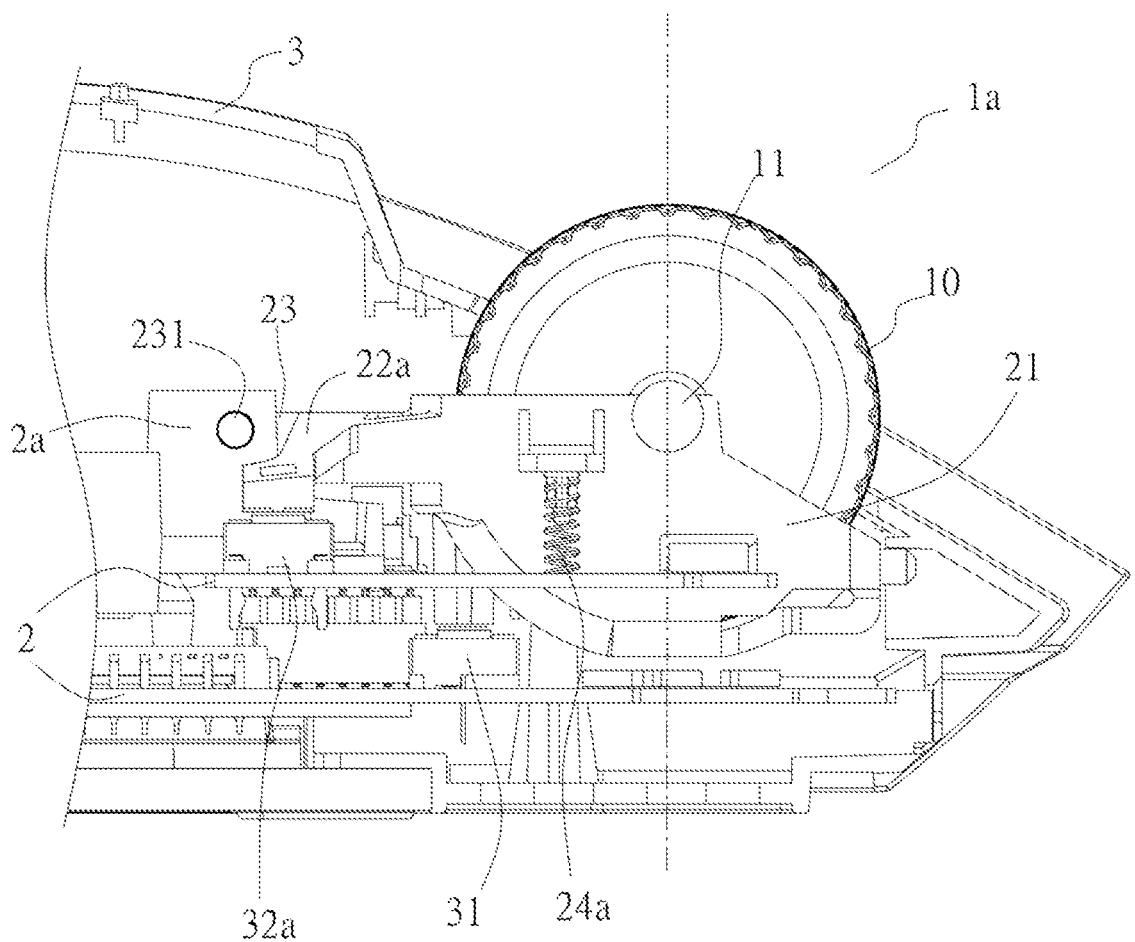
FIG. 2 is a schematic side view of the input device according to the first embodiment of the present invention.
Figure 3:
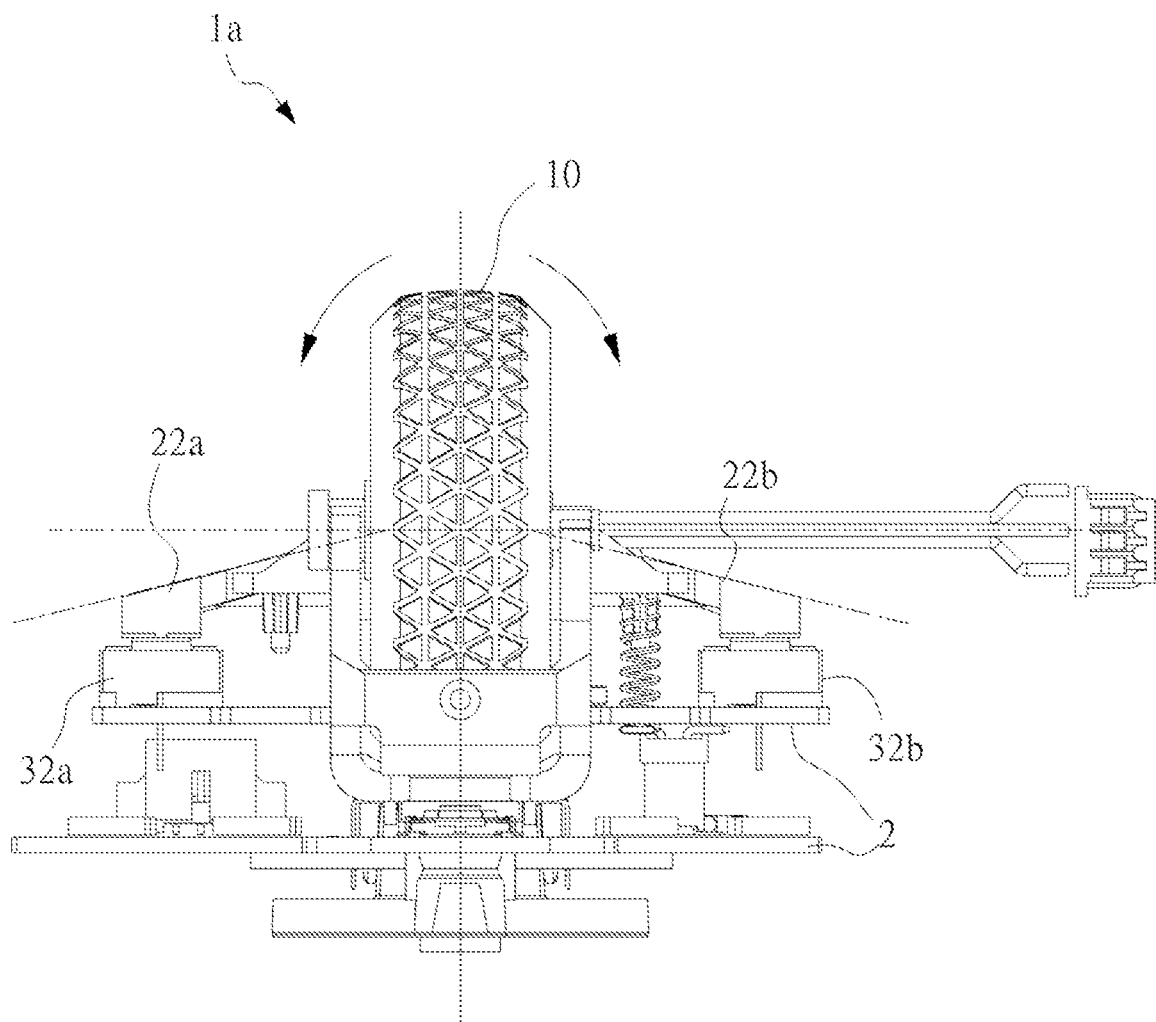
FIG. 3 is a schematic front view of the input device according to the first embodiment of the present invention.

First, referring to FIG. 1 to FIG. 3, FIG. 1 is a three-dimensional schematic view of an input device according to a first embodiment of the present invention, FIG. 2 is a schematic side view of the input device according to the first embodiment of the present invention, and FIG. 3 is a schematic front view of the input device according to the first embodiment of the present invention.

It should be firstly noted that the present invention provides an input device 1a. A user can operate the input device 1a to control a corresponding electronic device. The input device 1a may be disposed in various mouse devices, keyboard devices, or the like, but the scope of application of the input device 1a is not limited thereto. In the first embodiment of the present invention, the input device 1a may be applied in a mouse device, where the input device 1a is disposed in the mouse device and is wrapped by a housing 3. Because the shape of the housing 3 of the mouse device is not the key point of the present invention, details are not described herein. The input device 1a includes a circuit board 2, a wheel 10, a supporting frame 20, a push button switch 31, a left tilt switch 32a, and a right tilt switch 32b. The surface of the wheel 10 may be made of rubber. The wheel 10 has a rotary shaft 11 and is pivotally connected to the supporting frame 20 by the rotary shaft, so that the wheel 10 may be toggled by the user to send a control instruction to cause the electronic device to execute the instruction. Because this technology is well known those of ordinary skill in the art to which the present invention belongs, details are not described herein.

The supporting frame 20 is configured to support the wheel 10 and is adapted to be driven by the wheel 10. The supporting frame 20 includes a body 21, a left extension arm 22a, a right extension arm 22b, a first supporting portion 23 and a second supporting portion 24a. The wheel 10 is pivotally connected to the body 21 by the rotary shaft 11, so that the wheel 10 can rotate relative to the body 21, and the user can control the wheel 10 to drive the supporting frame 20 to press downward and tilt toward at least one side edge. The first supporting portion 23 is pivoted on an end of the body 21, so that the body 21 can be driven by the wheel 10 to press downward. The first supporting portion may be pivoted to a pivotal connection portion 2a of the circuit board 2 by a fixing shaft 231. The second supporting portion 24a is connected to a left side and a right side of the body 21. The second supporting portion 24a is a spring, configured to support the circuit board 2 and provide an elastic restoring force when the user presses the wheel 10. Therefore, the first supporting portion 23 and the second supporting portion 24a support the entire supporting frame 20, thereby bearing the weight of the wheel 10 and the force applied by the user to press the wheel 10.

The push button switch 31 is disposed on the circuit board 2 and corresponding to the body 21, and is disposed below the body 21, so that the user can press the wheel 10 to drive the body 21 to press downward to trigger the push button switch 31 to generate a corresponding control signal. As can be seen from FIG. 2, the second supporting portion 24a is disposed between the rotary shaft 11 and the first supporting portion 23, the push button switch 31 is disposed between the second supporting portion 24a and the first supporting portion 23, and the left extension arm 22a is also disposed between the second supporting portion 24a and the first supporting portion 23. Therefore, when viewed from a side of the input device 1a, the positions of the elements from front to rear are arranged in the following sequence: the rotary shaft 11, the second supporting portion 24a, the push button switch 31, the left extension arm 22a and the first supporting portion 23. Neither the second supporting portion 24a nor the first supporting portion 23 extends beyond the position of the rotary shaft 11.

In the first embodiment of the present invention, the input device 1a includes the left extension arm 22a, the right extension arm 22b, the left tilt switch 32a and the right tilt switch 32b, but the present invention is not limited thereto. In order to achieve the objective of tilt control, the input device 1a may also include a single extension arm to match to a single tilt switch. The left extension arm 22a and the right extension arm 22b respectively extend obliquely downward from the left side and the right side of the body 21. The left tilt switch 32a and the right tilt switch 32b are disposed on the circuit board 2, and are located below the left extension arm 22a and the right extension arm 22b. As shown in FIG. 3, the left extension arm 22a is disposed at the left side of the body 21 and corresponding to the left tilt switch 32a, and the right extension arm 22b is disposed at the right side of the body 21 and corresponding to the right tilt switch 32b. Therefore, when the user controls the wheel 10 to tilt toward the left, the left extension arm 22a is driven to tilt downward to trigger the left tilt switch 32a. Similarly, when the user controls the wheel 10 to tilt toward the right, the right extension arm 22b is driven to tilt downward to trigger the right tilt switch 32b. By means of the structure of the foregoing input device 1a, the user does not have to apply a large force to trigger the push button switch 31, the left tilt switch 32a or the right tilt switch 32b.

Figure 4:
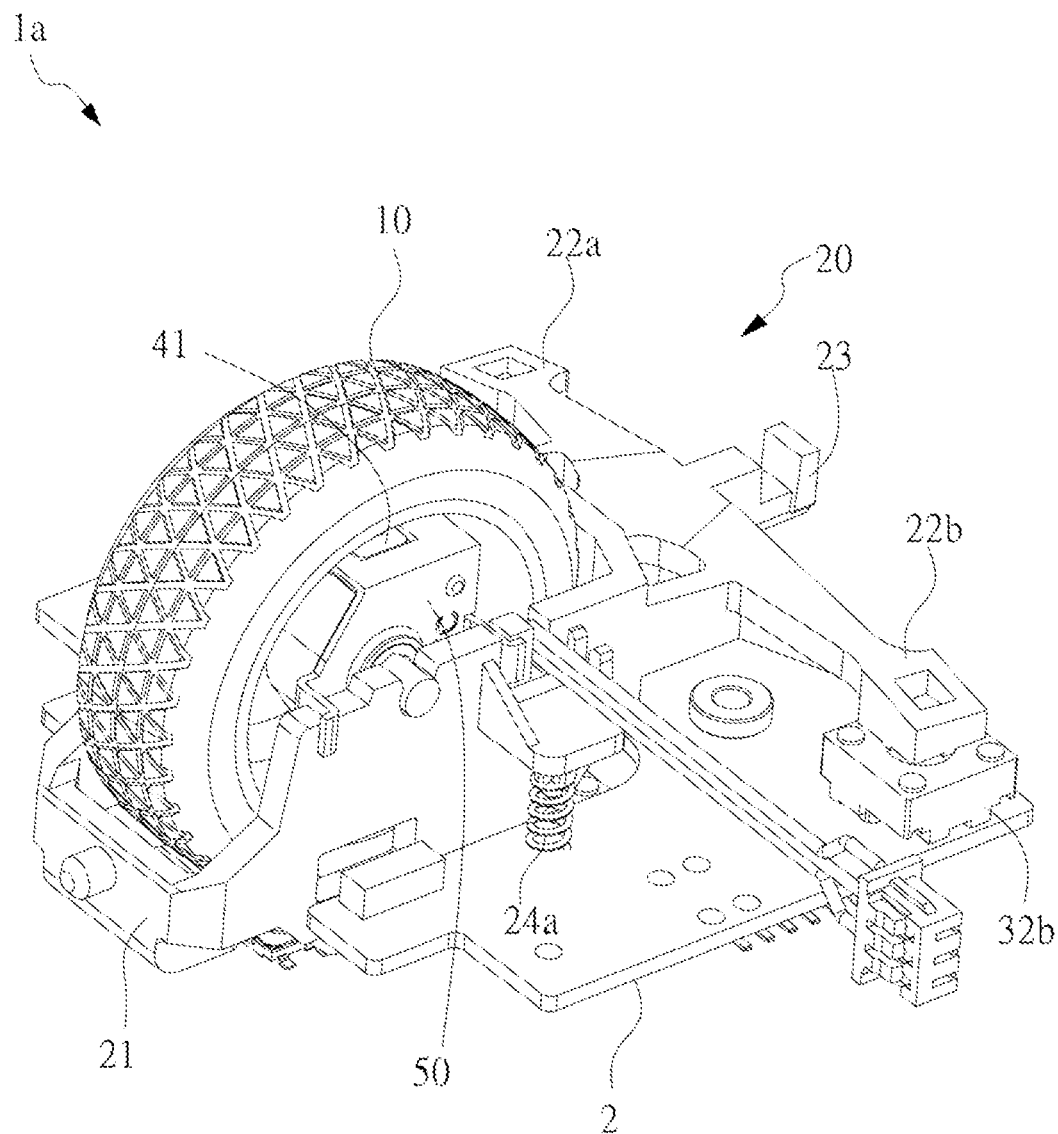
FIG. 4 is a three-dimensional schematic view of the input device according to the first embodiment of the present invention from another point of view.

Next, referring to FIG. 4, FIG. 4 is a three-dimensional schematic view of the input device according to the first embodiment of the present invention from another point of view.

In the first embodiment of the present invention, the input device 1a may further include a light emitting element 41. The light emitting element 41 may be a light-emitting diode. The light emitting element 41 is disposed on an element which does not rotate or tilt along with the wheel 10, on the supporting frame 20. For example, the light emitting element 41 is disposed on an encoder 50 configured to detect a rotation status of the wheel 10, but the present invention is not limited thereto. The light emitting element 41 extends into an inner side of the wheel 10, so as to emit light of different colors or brightness according to different control methods of the user, improving aesthetics of the input device 1a. However, the present invention is not limited the configuration that the light emitting element 41 is disposed on the inner side of the wheel 10.

Figure 5:
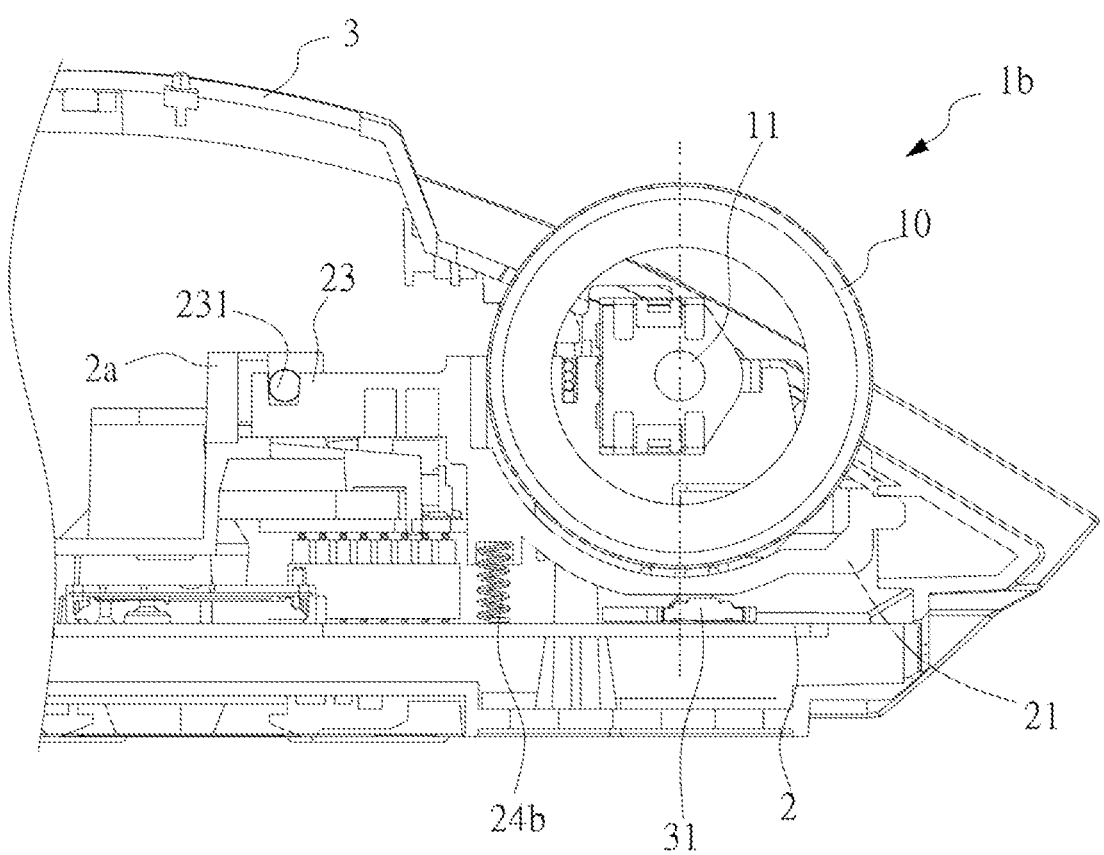
FIG. 5 is a schematic side view of an input device according to a second embodiment of the present invention.

Finally, referring to FIG. 5, FIG. 5 is a schematic side view of an input device according to a second embodiment of the present invention.

In the second embodiment of the present invention, the push button switch 31 of the input device 1b is disposed below the wheel 10, and the input device 1a has only one second supporting portion 24b. The second supporting portion 24b is located right below the body 21, and is disposed between the push button switch 31 and the first supporting portion 23. Therefore, when viewed from a side of the input device 1b, the positions of the elements from front to rear are arranged in the following sequence: the push button switch 31, the rotary shaft 11, the second supporting portion 24b, the left extension arm 22a and the first supporting portion 23. Neither the second supporting portion 24b nor the first supporting portion 23 extends beyond the position of the rotary shaft 11. By means of the structure of the foregoing input device 1b, the user also does not have to apply a large force to drive the body 21 to trigger the push button switch 31, the left tilt switch 32a or the right tilt switch 32b.

Therefore, the input devices 1a and 1b of the present invention enable the user to press or tilt the wheel 10 to generate a control instruction with ease, thereby resolving the deficiency of the related art.

It should be noted that the foregoing implementations are merely exemplary embodiments of the present invention. To avoid repeated descriptions, all possible modifications and combinations are not set forth herein. However, those of ordinary skill in the art shall understand that the foregoing modules or elements are not all necessary.

Meanwhile, to implement the present invention, other more detailed conventional modules or elements may also be included. The modules or elements may be omitted or modified according to the requirements, and there may be or may not be another module or element between any two modules. All possible implementations shall fall within the scope of the present invention as defined by the appended claims, as long as they do not depart from the basic architecture of the present invention.

What is claimed is:

1. An input device, comprising:
   a circuit board;
   a wheel, having a rotary shaft;
   a supporting frame, configured to support the wheel and adapted to be driven by the wheel, wherein the supporting frame comprises:
      a body, wherein the wheel is pivotally connected to the body by the rotary shaft, allowing the wheel to rotate relative to the body and drive the supporting frame to press downward and tilt toward at least one side edge;
      at least one extension arm, disposed at the side edge of the body;
      a first supporting portion, arranged on an end of the body to pivoted to a pivotal connection portion of the circuit board, so that the body can be driven by the wheel to press downward; and;
      a second supporting portion, connected to the body and supporting the circuit board, wherein the second supporting portion is disposed between the rotary shaft and the first supporting portion; wherein the first supporting portion and the second supporting portion support the body;
   a push button switch, disposed on the circuit board and corresponding to the body, wherein when the wheel is pressed, the wheel drives the body to press downward to trigger the push button switch; and;
   at least one tilt switch, disposed on the circuit board and corresponding to the at least one extension arm, wherein when the wheel tilts, the wheel drives the at least one extension arm to tilt to trigger the at least one tilt switch.

2. The input device according to claim 1, wherein the input device comprises a left tilt switch and a right tilt switch, and the supporting frame further comprises a left extension arm and a right extension arm, wherein the left extension arm is disposed at a left side of the body and corresponding to the left tilt switch, and the right extension arm is disposed at a right side of the body and corresponding to the right tilt switch.

3. The input device according to claim 1, wherein the supporting frame comprises two second supporting portions, respectively disposed at a left side and a right side of the body.

4. The input device according to claim 3, wherein the push button switch is disposed between the second supporting portion and the first supporting portion.

5. The input device according to claim 1, wherein the second supporting portion is disposed below the body.

6. The input device according to claim 5, wherein the second supporting portion is disposed between the push button switch and the first supporting portion.

7. The input device according to claim 1, wherein the second supporting portion is a spring.

8. The input device according to claim 1, wherein the first supporting portion is pivotally connected to a pivotal connection portion of the circuit board by a fixing shaft.

9. The input device according to claim 1, further comprising a light emitting element disposed at the supporting frame and extends into an inner side of the wheel.

* * * * *